United States Patent [19]

Vo

[11] Patent Number: 5,097,381

[45] Date of Patent: Mar. 17, 1992

[54] DOUBLE SIDEWALL TRENCH CAPACITOR CELL

[75] Inventor: Huy T. Vo, Boise, Id.

[73] Assignee: Micron Technology, Inc.

[21] Appl. No.: 596,856

[22] Filed: Oct. 11, 1990

[51] Int. Cl.[5] .................... H01L 29/78; H01L 21/70; H01G 4/06

[52] U.S. Cl. .................... 361/313; 357/23.6; 437/52

[58] Field of Search ....................... 361/311, 312, 313; 357/23.6, 51; 437/52

[56] References Cited

U.S. PATENT DOCUMENTS 4,849,854 7/1989 Eguchi ............................... 361/313
4,978,634 12/1990 Shen et al. ........................... 437/52

*Primary Examiner*—Donald Griffin
*Attorney, Agent, or Firm*—Workman, Nydegger & Jensen

[57] ABSTRACT

A double sidewall trench capacitor cell particularly adapted for use as a memory cell capacitor of a DRAM is disclosed. The preferred embodiments of the invention include a loop shaped trench formed in the semiconductor substrate upon which the integrated circuit is formed. The trench preferably forms a closed loop and in the described embodiment is a circular trench. The sidewalls and the bottom of the trench are covered with a dielectric material. The sidewalls and bottom of the trench function as one plate of a capacitor formed by the completed structure. The dielectric layer is covered with a material which functions as a cell node and serves as the opposing plate of the capacitor structure. The cell node may be formed by filling the trench with a relatively conductive material covering substantially all of the dielectric layer in the trench. The described capacitor structure provides increased charge storage on the capacitor structure without increasing the planar area occupied by the structure.

25 Claims, 2 Drawing Sheets

DOUBLE SIDEWALL TRENCH CAPACITOR CELL

BACKGROUND

1. The Field of the Invention

This invention relates to integrated circuit structures. More particularly, the present invention relates to capacitor structures used with dynamic random access memory cells formed on integrated circuits.

2. The Background Art

The miniaturization of electrical components and their integration on a single piece of semiconductor material has been the catalyst of a world-wide information revolution. As integrated circuit technology has progressed, it has been possible to store ever increasing amounts of digital data in a smaller space at less expense and still access the data randomly, quickly, and reliably. Central to this greatly increased ability to store and retrieve data has been the dynamic random access memory, or DRAM, fabricated as an integrated circuit.

In the case of mass produced DRAMs, the cost per bit of memory provided has historically decreased as the number of bits which can be reliably stored on each integrated circuit has increased. Thus, it is advantageous to pack as many memory cells as practically possible on each square unit of planar area available on an integrated circuit.

The memory cells of DRAMs are comprised of two main components: a transistor and a capacitor. The capacitor of each memory cell functions to store an electrical charge representing a digital value, e.g., a charged capacitor representing a 1 and a discharged capacitor representing a 0, with the transistor acting as a switch to connect the capacitor to the "outside world" via decoding and other circuitry.

The state of the art has progressed to the point where the transistor can be made much smaller than the capacitor. In order to function properly, the capacitor must possess a minimum amount of capacitance. Generally, it is desirable that each memory cell capacitor, also referred to as a "storage node," possess as much capacitance as possible, but at least $20 \times 10^{-15}$ farads, and preferably more than $60 \times 10^{-15}$ farads, of charge storage capacity. If a capacitor exhibits too little capacitance, it will loose any charge placed upon it too rapidly causing errors in data storage.

The capacitive value of a capacitor is dependent upon the dielectric constant of the material placed between the plates of the capacitor, the distance between the plates, and the effective area of the plates. In many cases, the material used as a dielectric between the plates is limited to only a few materials. Also, the minimum distance between the capacitor plates is generally limited to a particular value where the number of defects are kept to an acceptably low value. Thus, the one parameter which can be varied to obtain an increased storage capacity is the area of the plates.

Thus, it is a goal of DRAM designers to increase the area of the capacitor plates as much as possible. Concurrently, it is also a goal to reduce the planar area occupied by each capacitor to a minimum so that as many memory cells as possible can be packed onto a single integrated circuit. Thus, various three dimensional structures have been proposed and adopted in the art to maintain the value of a capacitor at a desirably high level while keeping the planar area devoted to the capacitor at a minimum.

Among the proposed schemes for maintaining cell capacitance while decreasing the planar area devoted to the cell is one described in Lu, N. C. C., "Advanced Structures for Dynamic RAMs" *IEEE Circuits and Devices Magazine* 27-35 (Jan. 1989) and described as a "trench-transistor cell." In the trench-transistor cell described in the Lu paper, the capacitor cell becomes a vertical structure with the access transistor also becoming vertical and placed above the cell capacitor. While the described trench cell provides greater capacitor plate area in a small planar area when compared to planar capacitor structures, the described trench structure provides only a modest increase in charge storage capacity, as well as additional difficulties during fabrication.

In view of the foregoing, it would be an advance in the art to provide a structure and method for forming a capacitor structure on an integrated circuit which provides increased capacitance in a decreased planar area. It would be another advance in the art to provide a structure and method for forming a capacitor structure on an integrated circuit which provides a high capacitance per square unit of planar area and which can be reliably manufactured and operated. It would be another advance in the art to provide an improved structure and method for forming a capacitor structure on an integrated circuit which is particularly adapted for integration into DRAM memory cells.

BRIEF SUMMARY AND OBJECTS OF THE INVENTION

In view of the above described state of the art, the present invention seeks to realize the following objects and advantages.

It is a primary object of the present invention to provide a structure and method for forming an integrated circuit capacitor cell which provides increased capacitance in a decreased planar area.

It is another object of the present invention to provide a structure and method for forming an integrated circuit capacitor cell which provides a high capacitance per square unit of planar area and which can be reliably manufactured and operated.

It is another object of the present invention to provide a structure and method for forming an integrated circuit capacitor cell which is particularly adapted for integration into a DRAM.

These and other objects and advantages of the invention will become more fully apparent from the description and claims which follow, or may be learned by the practice of the invention.

The present invention comprises a three dimensional trench structure which is particularly adapted for use as a memory cell capacitor in a DRAM. The preferred embodiments of the invention include a loop trench formed in the semiconductor substrate upon which the integrated circuit is formed.

The trench preferably forms a closed loop and in the described embodiment is a circular trench. The loop trench includes an inner sidewall and an outer sidewall. The sidewalls of the described embodiment converge toward each other at the bottom of the trench or be parallel in alternative embodiments of the invention. The inner and outer sidewalls of the trench function as a plate for the completed capacitor structure.

Dielectric layers are formed over substantially all of the inner sidewall and outer sidewall. Desirably, if a discrete bottom is formed in the trench, a dielectric layer is also formed over the bottom. In the described embodiments of the invention, both the sidewalls and the bottom are electrically insulated from the interior of the trench by the dielectric layers. The dielectric layers can desirably comprise one continuous dielectric layer over both sidewalls and the trench bottom.

The dielectric layer, or layers, which are formed over the trench sidewalls, and bottom if present, are covered with a material which functions as a cell node. The cell node can also be referred to as a capacitor plate which opposes the plate formed by the trench sidewalls. The cell node may be formed by filling the trench with a relatively conductive material and covering substantially all of the dielectric layer in the trench.

Together, the sidewalls and bottom of the trench function as one plate of the resulting capacitor structure while the cell node functions as the opposing capacitor plate. The present invention provides increased charge storage on the capacitor structure without increasing the planar area occupied by the structure.

BRIEF DESCRIPTION OF THE DRAWINGS

In order that the manner in which the above-recited and other advantages and objects of the invention are obtained can be appreciated, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention and the presently understood best mode thereof will be described and explained with additional specificity and detail through the use of the accompanying drawings in which.

DETAILED DESCRIPTION OF THE PREFERRED EMBODIMENT

Figure 1:
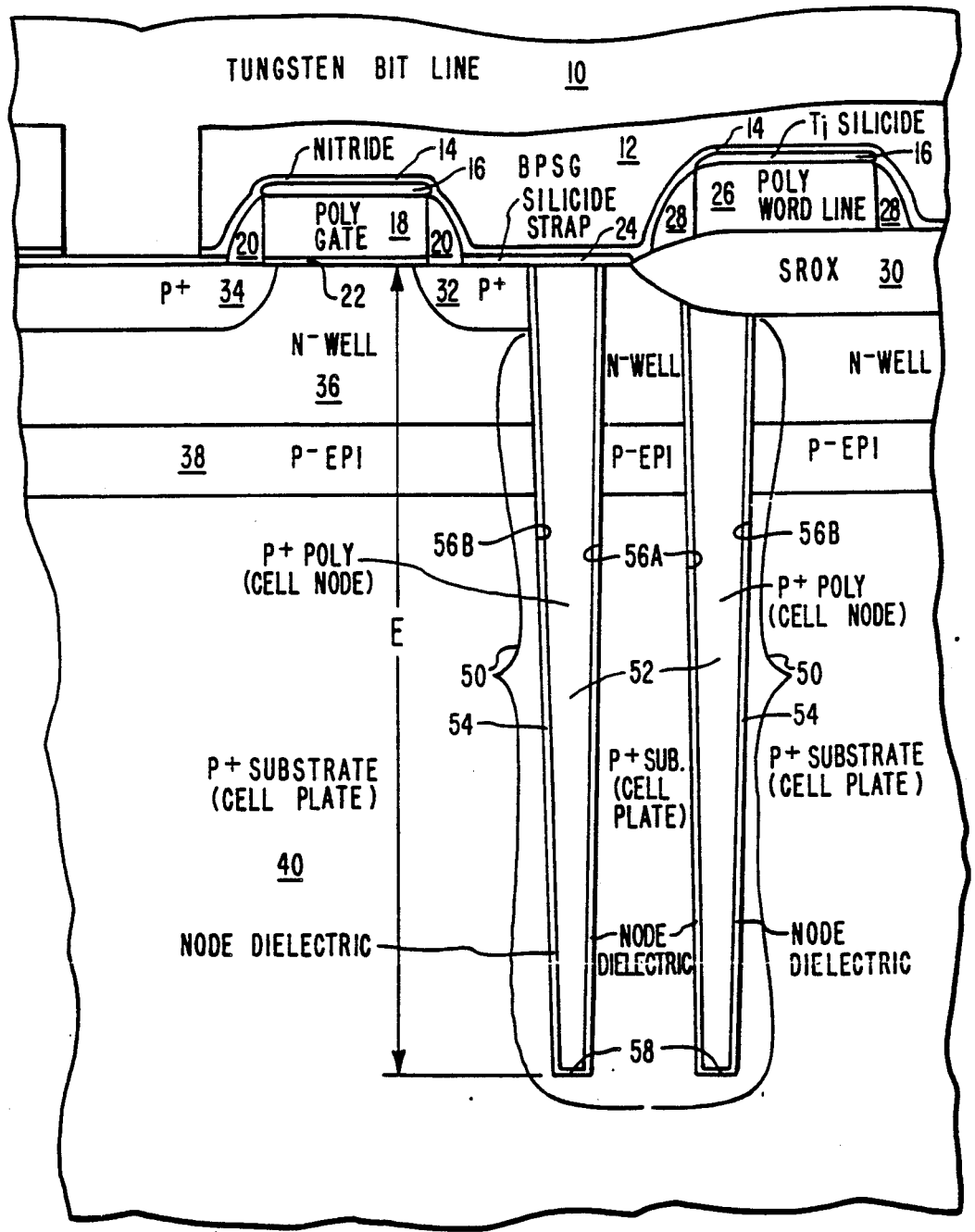
FIG. 1 is a cross sectional view of the presently preferred structure of the double sidewall trench capacitor of the present invention.

Reference will now be made to the drawings wherein like structures will be provided with like reference designations. It will be understood that the drawings included herewith only provide diagrammatic representations of the presently preferred structures of the present invention and devices falling within the scope of the present invention may include structures different than those shown in the drawings.

FIG. 1 provides a cross sectional view of the presently preferred embodiment of the present invention and associated structures comprising an individual DRAM cell. It will be appreciated that the present invention has uses other than with DRAM cells. Furthermore, the present invention has application with DRAM cells having structures other than that illustrated in FIG. 1.

Those possessing skill in the pertinent art will understand the processes and techniques necessary to fabricate the represented structures after an examination of the following description. Moreover, the structures represented in the drawings will be described in order of convenience, not necessarily in any order of fabrication.

Illustrated in FIG. 1 is a substrate 40 which has been heavily doped (indicated by the "+" symbol with a P type material. Since the substrate 40 is heavily doped, it is a body of relatively conductive material. Upon the P+ substrate 40, a P− epitaxial layer 38 is formed (the "−" sign signifying lightly doped). An N− well 36 is formed above the P− epitaxial layer 38.

Represented in FIG. 1 are the structures associated with the double sidewall trench capacitor cell and which comprise the structures of the DRAM. A metallic (tungsten) bit line 10 (also sometimes referred to as a digit line) is represented in longitudinal cross section. A polysilicon word line 26 is represented in lateral cross section.

Oxide spacers 28 are provided on both sides of the word line 26. A titanium silicide layer 16 is formed on the top of the wordline 26 and the polysilicon gate 18. A silicon nitride layer 14 is deposited over the word line 26 and the polysilicon gate 18, and the space adjoining therebetween. A silicide layer 16 is formed between the top nitride layer 14 and the polysilicon gate 18. Oxide spacers 20 are also formed on both sides of the polysilicon gate 18.

A bulk phosphosilicate glass (BPSG) layer 12 covers the polysilicon gate 18 an the polysilicon word line 26 structures. A silicide strap 24 is formed between a P+ region 32 an SROX region 30. A P+ region 34 is also formed in the N− well 36 created in the substrate.

The structures of the double sidewall trench capacitor are generally designated by the area enclosed in brackets 50. The double sidewall trench capacitor cell is formed through the N− well 36 and the P− epitaxial layer 38, and in the P+ substrate 40.

Figures 2, 3:
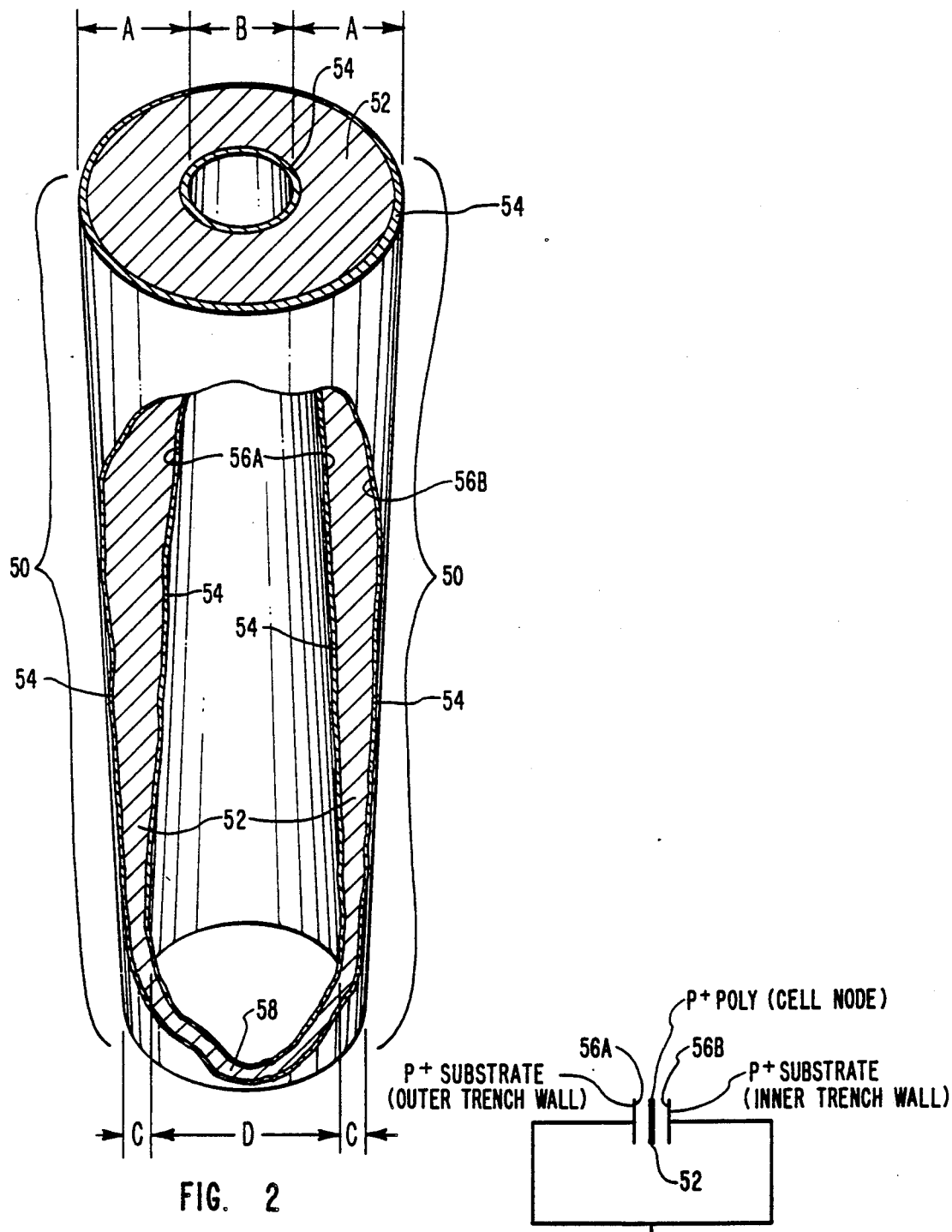
FIG. 2 is a perspective view of the double sidewall trench capacitor structure of the present invention.
FIG. 3 is an electrical schematic diagram representing the equivalent electrical circuit arrangement of the double sidewall trench capacitor of the present invention.

FIG. 2 provides a perspective view of the double sidewall structure shown in cross section in FIG. 1 and both figures will now be referred to in the following discussion.

The double sidewall trench capacitor of the present invention provides an increase in capacitor plate area of between 45 percent and 70 percent over other selected trench capacitor structures. This increase in capacitor plate area, and thus charge storage capacity, is derived from the use of a loop-shaped trench having both an inner and an outer sidewall, both the inner and outer sidewall being used to form the capacitor plates. The actual configuration of the cell will determine the increase in plate area which is obtained.

The double sidewall trench cell is fabricated by forming a cylindrical trench through the N− well 36 and the P− epitaxial layer 38 and into the P+ substrate 40 as shown best in FIG. 1. It will be appreciated that the trench could be oriented other than vertically using appropriate processing techniques. Moreover, the trench can be formed in materials other than the substrate 40. For example, additional material can be built up above the substrate to form a relatively conductive body into which the trench can extend.

As represented in FIGS. 1 and 2, the inner sidewall 56A and the outer sidewall 56B of the illustrated trench taper toward each other. It will be appreciated that the capacitor plate area varies as the taper of the trench sidewalls varies, Moreover, the trench may be formed with a bottom, as shown at 58. Also, in the case of the described embodiment, forming the trench as deeply as possible into the P+ substrate 40 will also increase the plate area.

The trench structure of the described embodiment, as best seen in FIG. 2, is cylindrical but other shapes can also be used. Desirably, the trench structure may assume a loop shape. Such a loop shape can be, as represented in the drawings, circular (or cylindrical), a polygonal shape, or even an irregular curved or other shape. For example, the loop shape may take a square configuration. All of the loop shapes may be open or closed. The cylindrical shape shown in FIG. 2 is an example of a preferred closed loop trench.

With the loop trench having been formed, a thin node dielectric layer 54 is formed on the inner sidewall 56A, the bottom 58 of the trench, and the outer sidewall 56B. Generally, the dielectric layer 54 will be as thin as possible to maximize the charge storage capacity of the cell. As will be understood, considerations such as keeping the occurrence of defects in the dielectric layer 54 to an acceptable level and the material used to form the dielectric layer 54 will often determine the thickness of the dielectric layer 54.

After formation of the dielectric layer 54, the trench is filled with heavily doped polysilicon which functions as the conductive cell node 52. It will be appreciated that while it is presently desirable to fill the trench with a conductive material, due to ease of fabrication and decreased electrical resistance, the cell node could be created by forming a layer of relatively conductive material over the dielectric layer 54 rather than filling the trench. The cell node 52 is electrically connected to the gate of the access device by the P+ region 32, and silicide strap layer 24.

Typical presently preferred dimensions of the represented structure are:

| FIGS. 1 and 2 Reference Designations | Description | Preferred Range |
| --- | --- | --- |
| A | upper trench width | 0.2–0.7 (microns) |
| B | inner sidewall upper diameter | 0.1–0.5 (microns) |
| C | bottom trench width | 0.0–0.7 (microns) |
| D | inner sidewall bottom diameter | 0.2–1.0 (microns) |
| E | depth | 5.0–15.0 (microns) |

The double sidewall trench capacitor structure may be fabricated using materials and techniques which are now available, such as conventional photolithography techniques or X-ray lithography, or other standard materials and techniques which may become available in the art.

FIG. 3 provides a schematic diagram showing the equivalent electrical circuit formed by the double sidewall trench capacitor represented in FIGS. 1 and 2. As is represented in FIG. 3, the heavily doped substrate comprising both inner sidewall 56B and the outer sidewall 56A of the trench form two grounded plates of the capacitor. Likewise, the heavily doped polysilicon cell node 52 functions as a central plate to the inner sidewall 56A and the outer sidewall 56B of the capacitor. Significantly, the present invention increases the area of the capacitor over the other trench capacitors by the area of the inner trench sidewall 56B.

In view of the foregoing, it will be appreciated that the present invention provides an integrated circuit capacitor structure which provides increased capacitance in a decreased planar area which can be reliably manufactured and operated. The present invention also provides a structure and method for forming an integrated circuit capacitor which is particularly adapted for integration into DRAM memory cells.

The present invention may be embodied in other specific forms without departing from its spirit or essential characteristics. The described embodiment is to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A capacitor structure for use on an integrated circuit comprising:
   a body of relatively conductive material;
   a loop trench formed in the body, the loop trench having an inner sidewall and an outer sidewall;
   a dielectric layer formed on the inner sidewall and the outer sidewall wherein the inner sidewall and the outer sidewall taper toward each other; and
   a relatively conductive layer formed so as to cover the dielectric layer, the inner and outer sidewall of the trench functioning as a first capacitor plate and the relatively conductive layer functioning as a second capacitor plate.

2. A capacitor structure for use on an integrated circuit as defined in claim wherein the relatively conductive body comprises a semiconductor substrate.

3. A capacitor structure for use on an integrated circuit as defined in claim 1 wherein the loop trench comprises a closed loop trench.

4. A capacitor structure for use on an integrated circuit as defined in claim 3 wherein the closed loop trench comprises a circular trench.

5. A capacitor structure for use on an integrated circuit as defined in claim 1 wherein the depth of the trench is in the range from about 5.0 microns to about 15.0 microns, wherein the upper trench width is in the range from about 0.2 microns to about 0.7 microns, and wherein the bottom trench width is in the range from about 0.0 microns to about 0.7 microns.

6. A capacitor structure for use on an integrated circuit as defined in claim 1 wherein the dielectric layer covers substantially all of the inner sidewall and the outer sidewall.

7. A capacitor structure for use on an integrated circuit as defined in claim 6 wherein the trench has a bottom and the dielectric layer substantially covers the bottom of the trench.

8. A capacitor structure for use on an integrated circuit as defined in claim 1 wherein the relatively conductive layer comprises a cell node.

9. A capacitor structure for use on an integrated circuit as defined in claim 8 wherein the cell node comprises a material substantially filling the trench and covering the dielectric layer.

10. A capacitor structure for use on an integrated circuit as defined in claim 1 wherein the integrated circuit comprises a dynamic random access memory cell comprising an access device, a bit line, and a word line and wherein the loop trench comprises a closed loop trench and wherein the dielectric layer covers substantially all of the inner sidewall and the outer sidewall of the trench and wherein the relatively conductive layer comprises a cell node.

11. A dynamic random access memory cell comprising:
   a heavily doped substrate;
   an access device;
   a closed loop trench formed in the substrate;
   an inner sidewall formed in the closed loop trench;
   an outer sidewall formed in the closed loop trench, the inner and outer sidewalls tapering toward each other toward the bottom of the trench;
   a dielectric layer formed over substantially all of the inner sidewall and the outer sidewall;
   a cell node covering substantially all of the dielectric layer in the trench, the inner and outer sidewalls of the trench formed in the substrate acting as a first capacitor plate and the cell node acting as an opposing second capacitor plate such that a charge can be stored using the capacitor plates, the stored charge representing a logical state of the memory cell.

12. A dynamic random access memory cell as defined in claim 11 wherein the depth of the circular trench is in the range from about 5.0 microns to about 15.0 microns.

13. A dynamic random access memory cell as defined in claim 12 wherein the upper trench width is in the range from about 0.2 microns to about 0.7 microns.

14. A dynamic random access memory cell as defined in claim 13 wherein the closed loop trench comprises a bottom and wherein the bottom trench width is in the range from about 0.0 microns to about 0.7 microns.

15. A dynamic random access memory cell as defined in claim 11 wherein the access device comprises a field effect transistor.

16. A dynamic random access memory cell as defined in claim 11 wherein the closed loop trench comprises a cylindrical trench.

17. A dynamic random access memory cell as defined in claim 11 wherein the substrate is electrically grounded.

18. A dynamic random access memory cell as defined in claim 11 wherein the heavily doped substrate and the cell node each comprise a relatively conductive material.

19. A method of forming a capacitor structure on an integrated circuit substrate, the method comprising the steps of:
   forming a loop trench in the substrate, the loop trench having an inner sidewall and an outer sidewall wherein the inner sidewall and the outer sidewall converge toward each other;
   forming a dielectric layer over the inner sidewall and over the outer sidewall;
   forming a cell node over the dielectric layer in the trench, the inner and outer sidewalls of the trench formed in the substrate acting as a first capacitor plate and the cell node acting as an opposing second capacitor plate such that a charge can be stored using the capacitor plates, the stored charge representing a logical state of the memory cell.

20. A method of forming a capacitor structure on an integrated circuit substrate as defined in claim 19 wherein the step of forming a loop trench comprises the step of forming a closed loop trench having an inner sidewall, an outer sidewall, and a bottom and further comprising the step of forming the dielectric layer over the trench bottom.

21. A method of forming a capacitor structure on an integrated circuit substrate as defined in claim 19 wherein the step of forming a loop trench comprises the step of forming a cylindrical trench.

22. A method of forming a capacitor structure on an integrated circuit substrate as defined in claim 19 wherein the step of forming a loop trench comprises the step of forming a loop trench wherein the inner sidewall and the outer sidewall converge toward the bottom of the trench.

23. A method of forming a capacitor structure on an integrated circuit substrate as defined in claim 19 wherein the step of forming the dielectric layer comprises the step of forming a dielectric layer which covers substantially all of the inner sidewall and the outer sidewall.

24. A method of forming a capacitor structure on an integrated circuit substrate as defined in claim 19 wherein the step of forming a cell node comprises the step of filling the trench with a relatively conductive material.

25. A method of forming a capacitor structure on an integrated circuit substrate as defined in claim 19 further comprising the steps of:
   forming an access device;
   forming a bit line; and
   forming a word line.

* * * * *

UNITED STATES PATENT AND TRADEMARK OFFICE
CERTIFICATE OF CORRECTION

PATENT NO. : 5,097,381

DATED : March 17, 1992

INVENTOR(S) : HUY THANH VO

It is certified that error appears in the above-identified patent and that said Letters Patent is hereby corrected as shown below:

```
Column 2, line 62, after "or" insert --be--
Column 4, line 27, "an" should be --and--
Column 4, line 64, "," should be --.--
Column 6, line 31, after "claim" insert --1--
```

Signed and Sealed this

Seventeenth Day of August, 1993

Attest:

BRUCE LEHMAN

Attesting Officer

Commissioner of Patents and Trademarks